(12) United States Patent
Karrer

(10) Patent No.: US 6,838,830 B2
(45) Date of Patent: Jan. 4, 2005

(54) HALF-BRIDGE

(75) Inventor: Volker Karrer, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/241,319

(22) Filed: Sep. 11, 2002

(65) Prior Publication Data

US 2003/0057530 A1 Mar. 27, 2003

(30) Foreign Application Priority Data

Sep. 11, 2001 (DE) .......................... 101 44 671

(51) Int. Cl.⁷ .......................... B60Q 1/26; H02K 27/00
(52) U.S. Cl. .......................... 315/78; 318/244
(58) Field of Search .......................... 315/77, 78, 79, 315/80; 318/244, 245, 264, 265

(56) References Cited

U.S. PATENT DOCUMENTS

| 5,329,214 | A | * | 7/1994 | Williamson et al. | ........ | 318/434 |
| 5,757,141 | A | * | 5/1998 | Wood | .......................... | 315/224 |
| 5,903,121 | A | * | 5/1999 | Heine et al. | ................. | 318/434 |
| 6,474,438 | B1 | * | 11/2002 | Penketh | ....................... | 180/444 |

* cited by examiner

Primary Examiner—Don Wong
Assistant Examiner—Minh Dien A
(74) Attorney, Agent, or Firm—Baker Botts L.L.P.

(57) ABSTRACT

Half-bridge circuit, especially for connection of an electric motor in a vehicle, with a low side circuit element (1) with a control input (3, G1), a high side circuit element (2) with a control input (6, G2), in which the low side circuit element (1) and the high side circuit element (2) are connected in series between the voltage terminal and a ground terminal and an output (OUT) to control an electrical load is arranged between the high side circuit element and the low side circuit element, implemented according to the invention by integration in an integrated circuit.

20 Claims, 3 Drawing Sheets

HALF-BRIDGE

BACKGROUND OF THE INVENTION

The invention concerns a half-bridge circuit, especially for connection of an electric motor in a vehicle.

It is known to control a DC motor with a so-called bridge circuit that permits operation of the DC motor in both directions of rotation. For this purpose, the known bridge circuit has four circuit elements, for example, in the form of power transistors, each two circuit elements being connected in series between ground and the supply voltage and forming a so-called half-bridge. The DC motor is connected with its two terminals to the connection points of the two series-connected circuit elements of the two half-bridges. In this manner, the DC motor can be acted upon by appropriate control of the four circuit elements with a voltage of the desired polarity, so that operation of the DC motor in both directions of rotation is possible. For this purpose, for example, only the high side circuit element is switched in the one half-bridge, whereas only the low side circuit element is switched in the other half-bridge. For pole reversal, the other circuit element is then switched in both half-bridges. It is then important that only one of the two circuit elements is switched in each half-bridge, whereas the other circuit element is blocked, in order to prevent a short-circuit along the half-bridge.

A problem here is the design-related parasitic inductance between the buffer capacitor and the high side or low side circuit element.

A shortcoming in the design of such a bridge circuit with discrete components is also the relatively large space requirements, because of the necessary bending geometries and line tensions, so that the spacing between the low side circuit element and the high side circuit element is relatively large, which leads to a relatively high-inductance connection to the intermediate circuits.

SUMMARY OF THE INVENTION

The underlying task of the invention is therefore to create a possibility for a bridge circuit that is suitable for series production and can be produced cost effectively and is optimal in terms of resistance-inductance.

The task is solved by a half-bridge circuit, especially for connection of an electric motor in a vehicle, with a low side circuit element with a control input, a high side circuit element with a control input, in which the low side circuit element and the high side circuit element are connected in series between a voltage terminal and a ground terminal and an output to control an electrical load is arranged between the high side circuit element and the low side circuit element, wherein it is designed as an integrated or molded or cast circuit.

The invention includes the general technical instruction to design a half-bridge circuit as an integrated circuit, in which the high side circuit element and the low side circuit element are arranged together on a semiconductor substrate. The circuit element can be attached, for example, by gluing or soldering. Preferably, additional components, like buffer capacitors and inductors, are arranged together with the low side and the high side circuit element on the semiconductor substrate.

The term integrated circuit is understood generally here and includes, for example, the ordinary understanding of the term, according to which numerous electronic components, like transistors, diodes, capacitors and resistors, can be arranged together on a chip. Moreover, the term integrated circuit, in the context of the invention, also includes a circuit arrangement that is merely arranged in a common housing or is molded or cast into a common housing.

The half-bridge circuit according to the invention can be implemented, for example, on a ceramic substrate or printed circuit board. The half-bridge circuit according to the invention can also be molded or merely mounted as an IC.

The circuit elements are preferably power transistors, like MOSFETs, which can be designed alternately as M-MOSFETs or as P-MOSFETs. The invention, however, is not restricted to these types of circuit elements. Bipolar transistors, thyristors or IGBTs can also be used as circuit elements.

Regardless of the type of employed circuit element, the circuit elements can be used in alternation with a positive or negative control logic, which is generally known. Circuit elements with different logic control can also be used for the two half-bridges of a bridge circuit. The circuit elements of one half-bridge can have a negative logic control, whereas the circuit elements of the other half-bridge have a positive logic control.

Depending on the corresponding control circuit, alternately self-conducting or self-blocking circuit elements can also be used, which need not be further explained.

In an advantageous variant of the invention, the integrated half-bridge circuit has electrically conducting support strips (leadframes), separated from the two circuit elements, that form the terminal contacts for the two control inputs of the circuit elements, the ground terminal, the voltage terminal and/or the output, in which the leadframes are connected by electrical connection lines to the circuit elements of the half-bridge circuit. Such support strips are also known as leadframes and permit simple contacting of half-bridge circuits.

In another variant of the half-bridge circuit according to the invention, the two circuit elements, on the other hand, have protruding conductor tracks that preferably consist of copper and permit simple contacting, so that separate leadframes can be dispensed with.

The terminal contacts of the half-bridge circuit according to the invention are therefore formed in the two variants just described either by protruding conductor tracks of the circuit elements or by separate leadframes. The terminal contacts are preferably arranged next to each other on the side edge of the integrated circuit. The terminal contacts are therefore preferably elongated and run essentially at right angles to a side edge of the integrated circuit.

In the preferred variant of the half-bridge circuit according to the invention, the two terminal contacts for the control inputs of the two circuit elements are arranged outside and preferably form side edges of the integrated circuit. The other terminal contacts of the integrated circuit are preferably arranged between the two terminal contacts for the control inputs of the two circuit elements.

In a variant of the invention, the terminal contacts for the output of the half-bridge circuit is arranged between the two terminal contacts for the two control inputs of the two circuit elements of the half-bridge circuit.

In another variant of the invention, the terminal contact for the output of the half-bridge circuit is next to the two [illegible] for the ground and voltage connection of the [illegible]. The ground and voltage connections are [illegible]. . . both circuit elements, which facilitate a two-layer design, in which the substrate or the half-bridge circuit is preferably one-layer, whereas the circuit board is preferably two-layer. The two terminal contacts for the voltage connection and the ground connection are preferably arranged right next to each other.

In a modified variant of the invention, the leadframes and/or additional electrical contact elements are riveted, soldered or welded on. The additional contact elements can have a hole for a screw connection or prongs for a press-fit or solder connection. The prongs of a contact element formed in this way can be bent in alternation in two spaced parallel planes, in order to achieve high current-carrying capacity.

The thickness of the leadframes, the protruding conductor tracks and/or the additional contact elements is preferably in the range from 200 $\mu$m to 400 $\mu$m, in which the thickness of 300 $\mu$m has proven to be particularly advantageous.

BRIEF DESCRIPTION OF THE DRAWINGS

Other advantageous modifications are further characterized in the dependent claims and are further explained below, together with the description of the preferred practical examples with reference to the figures. In the figures:

DETAILED DESCRIPTION OF THE PREFERRED EMBODIMENTS

Figure 1A:
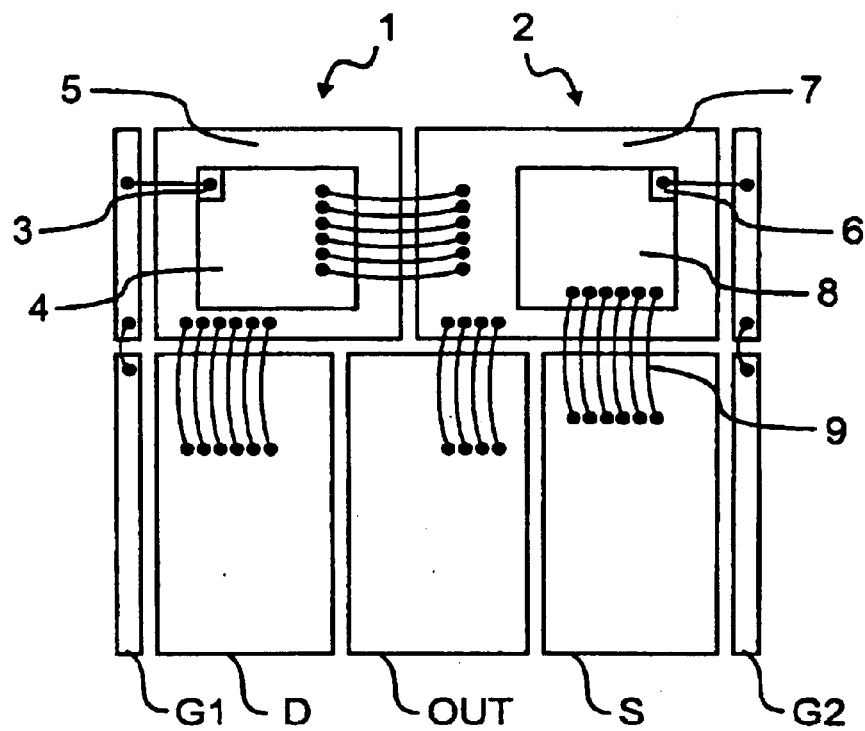
FIGS. 1a, 1b shows an integrated half-bridge circuit according to the invention with separate leadframes for contacting.

The integrated half-bridge circuit depicted in FIG. 1a serves to form a bridge circuit to control an electric motor in combination with an additional half-bridge circuit.

For this purpose, the half-bridge circuit has two P-channel MOSEFT transistors 1, 2 that are connected between the supply voltage and ground in series, in which the low side transistor 1 has a gate terminal 3, a source terminal 4 and a drain terminal 5.

Instead of two P-channel transistors, however, two N-channel transistors or a P-channel transistor and an N-channel transistor can be used.

In the same manner, the high side transistor 2 has a gate terminal 6, a drain terminal 7 and a source terminal 8.

The source terminal 8 of the high side transistor 2 is connected by bonding lines 9 to a separate leadframe S, otherwise electrically insulated from transistor 2, which forms a terminal contact for connection to the supply voltage.

The drain terminal 7 of the high side transistor 2 is similarly connected via bonding lines similar to bonding lines 9 to the source terminal 7 of the low side transistor 1.

The drain terminal 5 of the low side transistor 1 is finally connected via bonding lines similar to bonding lines 9 to a separate leadframe D, otherwise electrically insulated from transistor 1, which forms a terminal contact for connection to ground.

The two transistors 1, 2 are therefore series-connected between the supply voltage and ground.

The gate terminal 3 of the low side transistor 1 is connected via a bonding line to a separate leadframe G1, otherwise electrically insulated from transistor 1, which forms a terminal contact to control transistor 1.

In the same manner, the gate terminal 6 of the high side transistor 2 is connected via a bonding line to a separate leadframe G2, otherwise electrically insulated from transistor 2, which forms a terminal contact to control the high side transistor 2.

Finally, the drain terminal 7 of the high side transistor 2 and therefore the source terminal 4 of the low side transistor 1 are connected via bonding lines similar to bonding lines 9 to a separate leadframe OUT, otherwise electrically insulated relative to the two transistors 1, 2, which forms a voltage tap for the DC motor being controlled.

The integrated half-bridge circuit according to the invention just described offers the advantage that, because of the limited spacing between the two circuit elements of the half-bridge, a low-inductance connection to the intermediate circuit is possible.

The leadframes G1, G2, D, OUT each run strip-like, parallel to each other, and are naturally electrically insulated relative to each other. In this variant, the leadframes G1 and G2 are significantly narrower than the other leadframes and form the side edges of the integrated circuit. The leadframe OUT is arranged in the center to control the DC motor, which is surrounded on the sides by the two leadframes D, S for connection to the voltage or ground terminal.

Figure 1B:
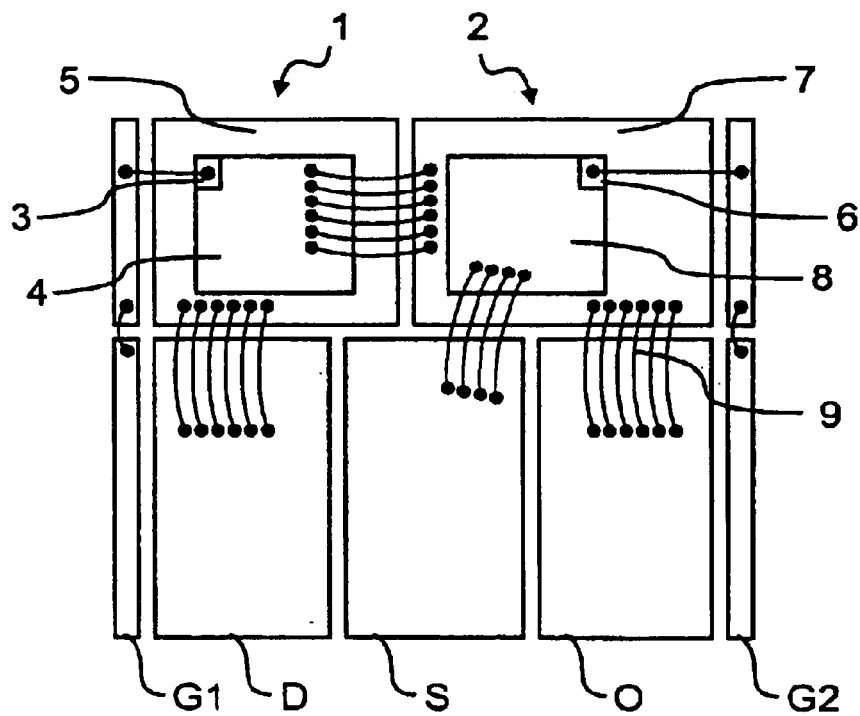

FIG. 1b shows an alternative practical example that agrees largely with the practical example just described and depicted in FIG. 1, so that the same reference numbers are used subsequently and the description just offered is largely referred to, to avoid repetition.

The difference of the practical example depicted in FIG. 1b relative to the practical example depicted in FIG. 1 consists of the fact that the two leadframes D, S are arranged right next to each other for connection to the supply voltage and ground, whereas the leadframe OUT is arranged on the outside for control of the DC motor. This offers the advantage that a two-layer design in the integrated half-bridge circuit is more readily implemented.

The alternative practical example depicted in FIG. 2a also largely agrees with the practical example depicted in FIG. 1a, so that the same reference numbers in this respect are used subsequently and the description relative to FIG. 1a is referred to, to avoid repetition.

Figure 2A:
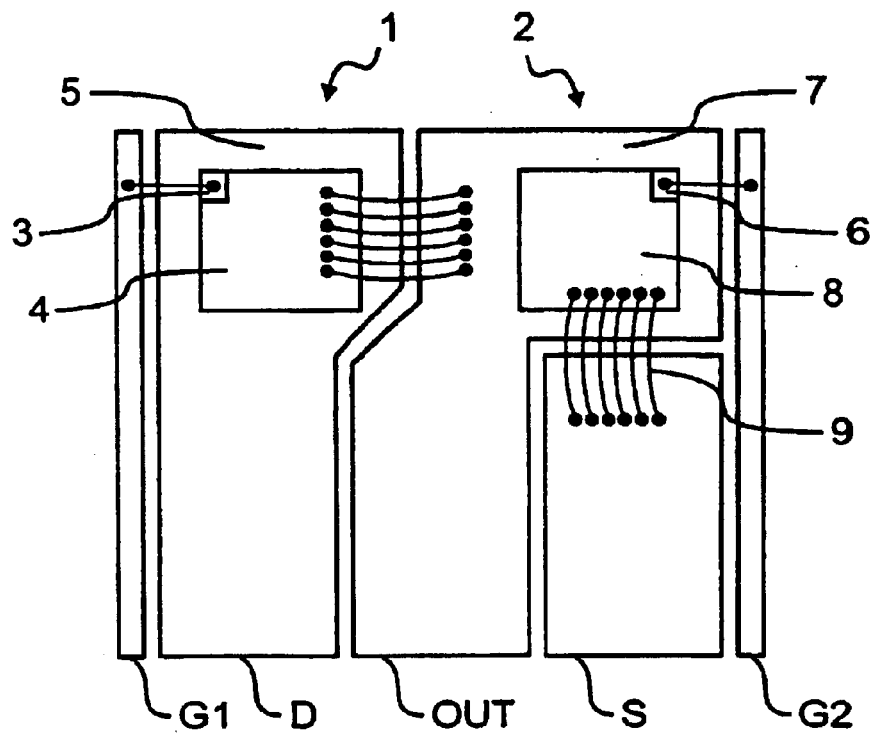
FIGS. 2a, 2b shows an alternative variant of a half-bridge circuit according to the invention with protruding conductor tracks of the two circuit elements that form terminal contacts.

The peculiarity of the practical example depicted in FIG. 2a consists essentially of the fact that no separate leadframes are used to form the terminal contacts D, OUT and S. Instead, the two transistors 1, 2 have protruding conductor tracks made of copper that form the terminal contacts for the ground connection, the supply voltage and the voltage tap OUT for the DC motor.

The terminal contact OUT for the DC motor being controlled is arranged here, as in FIG. 1a, also in the center between the two terminal contacts D and S for the supply voltage and ground.

Finally, the practical example depicted in FIG. 2b also largely agrees with the practical example depicted in FIG. 1a, so that the same reference numbers are used subsequently in this respect and the description for FIG. 1a is referred to.

The peculiarity of this practical example, in the first place, consists of the fact that no separate leadframes are present as terminal contacts. Instead, the two transistors 1, 2, as in FIG. 2a, have protruding conductor tracks that form the terminal contacts for connection to the supply voltage, ground and the DC motor being controlled.

Figure 2B:
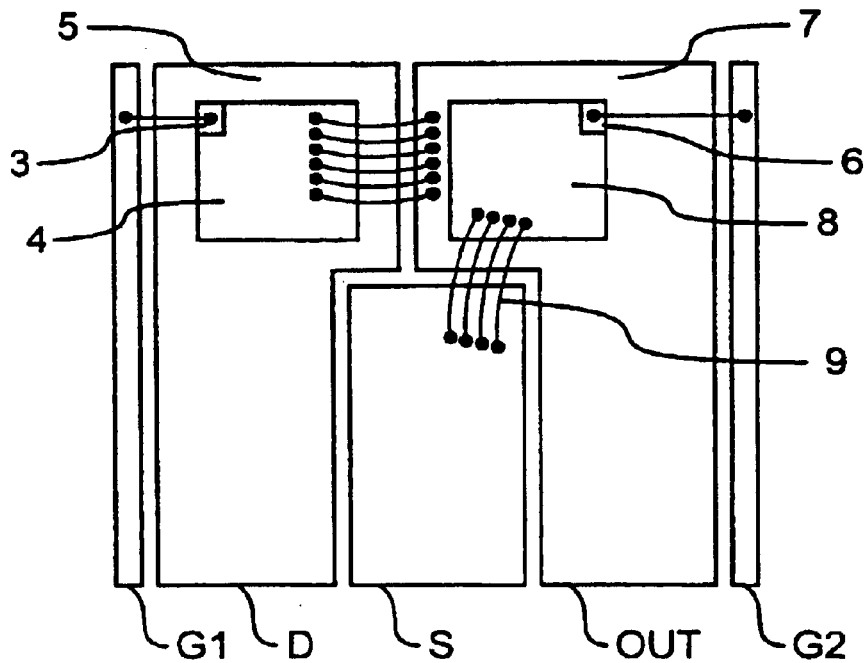

In the second place, the peculiarity of the practical example depicted in FIG. 2b consists of the fact that the terminal contact OUT for the DC motor is arranged outside, next to the directly adjacent terminal contacts D, S for the supply voltage and ground, which facilitates a two-layer design.

Figure 3A:
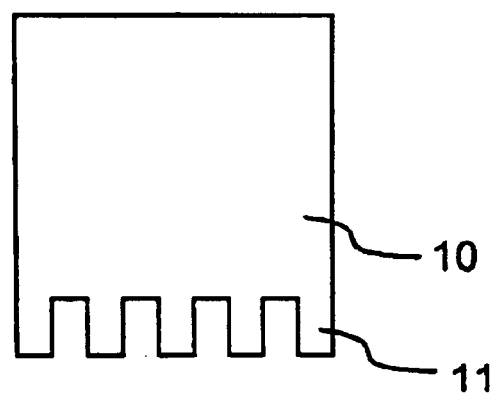
FIGS. 3a, 3b, and 3c shows practical examples of additional contact elements.
Figure 3B:
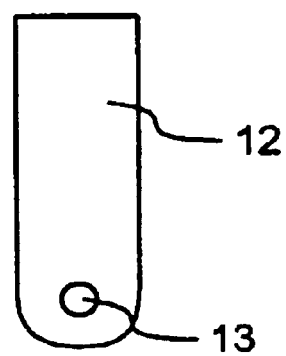
Figure 3C:
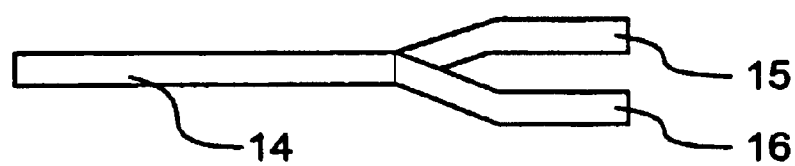

FIGS. 3a to 3c finally show a possible variance of additional contact elements that are press-fit, riveted, soldered or welded onto the leadframes G1, D, OUT, S or G2 or the protruding conductor tracks of transistors 1 and 2, so that the current carrying capacity is advantageously increased.

It should be noted here that the leadframes G1, D, OUT, S and/or G2 can have the same shape as the additional contact element.

The contact element 10 depicted in FIG. 3a is used to produce a solder or press-fit connection and, for this purpose, has several prongs 11 that are arranged equidistant and parallel to each other on the face of contact element 10.

FIG. 3b, on the other hand, shows an alternative practical example of a contact element 12 with a hole 13 to produce a screw connection.

Finally, the contact element 14 depicted in FIG. 3c is designed similarly to the contact element depicted in FIG. 3a, in which the individual prongs are bent in alternation in two parallel planes 15, 16, in order to achieve greater current-carrying capacity of the contact sites.

The invention is not restricted to the practical examples just described. Instead, a number of variants and modifications are conceivable that make use of the inventive idea, and also fall within its scope of protection.

What is claimed is:

1. Half-bridge circuit, especially for connection of an electric motor in a vehicle, with
   a low side circuit element with a control input,
   a high side circuit element with a control input,
   in which the low side circuit element and the high side circuit element are connected in series between a voltage terminal and a ground terminal and an output to control an electrical load is arranged between the high side circuit element and the low side circuit element,
   wherein it is designed as an integrated or molded or cast circuit, and
   wherein the integrated circuit has electrically conducting leadframes separated from the two circuit elements that form terminal contacts for the two control inputs, the around terminal, the voltage terminal and/or the output, in which the leadframes are connected at least partially by electrical connection lines to the circuit elements.

2. Half-bridge circuit according to claim 1,
   wherein the terminal contacts are arranged next to each other on a side edge of the integrated circuit.

3. Half-bridge circuit according to claim 2,
   wherein the two terminal contacts are arranged on the outside for the control inputs of the two circuit elements.

4. Half-bridge circuit according to claim 3,
   wherein the terminal contact for the output is arranged between the two terminal contacts for the voltage terminal and the ground terminal.

5. Half-bridge circuit according to claim 3,
   wherein the terminal contact for the output is arranged next to the two terminal contacts for the voltage terminal and the ground terminal.

6. Half-bridge circuit according to claim 1,
   wherein the two terminal contacts for the voltage terminal and the ground terminal are arranged right next to each other.

7. Half-bridge circuit according to claim 1,
   wherein the two terminal contacts for the voltage terminal and the ground terminal are arranged between the two terminal contacts for the two control inputs.

8. Half-bridge circuit according to claim 1,
   wherein the leadframes and/or additional electrical contact elements are press-fit, riveted, soldered or welded on.

9. Half-bridge circuit according to claim 1,
   wherein the leadframes and/or the additional electrical contact elements have a hole for a screw connection or prongs for a press-fit or solder connection.

10. Half-bridge circuit according to claim 1,
    wherein the prongs are bent in alternation in two spaced parallel planes.

11. A Half-bridge circuit according to claim 1,
    wherein the leadframes, the protruding conductor tracks and/or the additional contact elements have a copper layer with a thickness of 35 $\mu$m to 5 $\mu$m and preferably with a thickness of 300 $\mu$m.

12. Half-bridge circuit according to claim 1,
    wherein the integrated circuit is designed in one layer, whereas the substrate of the integrated circuit is two layers.

13. Method of manufacturing a half-bridge circuit with a low side circuit element with a control input and a high side circuit element with a control input, comprising the steps of:
    connecting the low side circuit element and the high side circuit element in series between a voltage terminal and a ground terminal,
    arranging an output to control an electrical load between the high side circuit element and the low side circuit element,
    integrating, molding or casting the circuit,
    separating electrically conducting leadframes from the two circuit elements that form terminal contacts for the two control inputs, the around terminal, the voltage terminal and/or the output, and
    connecting the leadframes at least partially by electrical connection lines to the circuit elements.

14. Method according to claim 13,
    further comprising the step of arranging the terminal contacts next to each other on a side edge of the integrated circuit.

15. Method according to claim 13,
    further comprising the step of arranging the two terminal contacts on the outside for the control inputs of the two circuit elements.

16. Method according to claim 13,
    further comprising the step of arranging the terminal contact for the output between the two terminal contacts for the voltage terminal and the ground terminal.

17. Method according to claim 13,
    further comprising the step of arranging the terminal contact for the output next to the two terminal contacts for the voltage terminal and the ground terminal.

18. Method according to claim 13,
    further comprising the step of arranging the two terminal contacts for the voltage terminal and the ground terminal right next to each other.

19. Method according to claim 13,
further comprising the step of arranging the two terminal contacts for the voltage terminal and the ground terminal between the two terminal contacts for the two control inputs.

20. Half-bridge circuit, especially for connection of an electric motor in a vehicle, with
- a low side circuit element with a control input,
- a high side circuit element with a control input,
- in which the low side circuit element and the high side circuit element are connected in series between a voltage terminal and a ground terminal and an output to control an electrical load is arranged between the high side circuit element and the low side circuit element,
- wherein it is designed as an integrated or molded or cast circuit, and
- wherein the high side circuit element and/or the low side circuit element have protruding conductor tracks that form the terminal contacts for the control input, the voltage terminal, the ground terminal and/or the output.

* * * * *